(12) United States Patent
May (10) Patent No.: US 7,809,345 B2
(45) Date of Patent: Oct. 5, 2010

(54) DIGITAL PLL AND APPLICATIONS THEREOF

(75) Inventor: Michael R. May, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 715 days.

(21) Appl. No.: 11/796,057

(22) Filed: Apr. 26, 2007

(65) Prior Publication Data

US 2008/0269928 A1    Oct. 30, 2008

(51) Int. Cl.
*H04B 1/06* (2006.01)

(52) U.S. Cl. .................................. 455/260

(58) Field of Classification Search ............... 455/260, 455/73, 313, 333; 331/1 A, 34, 25, 107 A, 331/17
See application file for complete search history.

(56) References Cited

U.S. PATENT DOCUMENTS

| | | | | |
|---|---|---|---|---|
| 5,598,448 A * | 1/1997 | Girardeau, Jr. | .............. | 375/376 |
| 6,903,615 B2 * | 6/2005 | Landman et al. | ............... | 331/57 |
| 7,170,965 B2 * | 1/2007 | Chien | .......................... | 375/376 |
| 7,202,750 B2 * | 4/2007 | May | .......................... | 331/1 A |
| 2004/0227578 A1 * | 11/2004 | Hamalainen | ............ | 331/107 A |
| 2005/0090222 A1 * | 4/2005 | Knecht et al. | ................ | 455/333 |
| 2007/0149144 A1 * | 6/2007 | Beyer et al. | .................... | 455/76 |
| 2009/0130988 A1 * | 5/2009 | Goldberg | ..................... | 455/73 |

* cited by examiner

*Primary Examiner*—Sanh D Phu
(74) *Attorney, Agent, or Firm*—Gary R. Stanford

(57) ABSTRACT

A digital phase locked loop (PLL) includes a digital phase detector, a digital loop filter, a digitally controlled oscillation module, and a variable feedback divider. The digital phase detector is coupled to produce a difference signal based on a phase difference between a reference oscillation and a feedback oscillation. The digital loop filter is coupled to process the difference signal to produce a control signal. The digitally controlled oscillation module is coupled to generate an output oscillation based on the control signal. The variable feedback divider is coupled to produce the feedback oscillation from the output oscillation based on a divider value and a controlled variable delay.

12 Claims, 8 Drawing Sheets digital PLL 75

FIG. 1
multi-function handheld device 10

FIG. 2
digital PLL 75

FIG. 3
digital PLL 75

FIG. 4
digital PLL 75

FIG. 5
digital PLL 75

FIG. 6
digital PLL 75

FIG. 7

DIGITAL PLL AND APPLICATIONS THEREOF

CROSS REFERENCE TO RELATED PATENTS

Not Applicable

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to digital circuitry and more particularly to phase locked loops.

2. Description of Related Art

Phase locked loops (PLLs) are known and widely used to generate a reliable clock signal. In general, an analog PLL includes a phase and/or frequency detector, a charge pump, a loop filter, a voltage controlled oscillator (VOC), and a feedback divider. The phase and/or frequency detector detects a phase and/or frequency difference between a reference oscillation (usually provided by a crystal oscillator circuit) and a feedback oscillation to produce an up signal when the feedback oscillation lags behind the reference oscillation, a down signal when the feedback oscillation leads the reference oscillation, or a neutral signal.

The charge pump converts the up signal into an up current, the down signal into a down current, and the neutral signal into a neutral current. The loops filter converts the currents into a control voltage that is provided to the VCO. The VCO generates an output oscillation based on the control voltage. The feedback divider divides the output oscillation by a divider value to produce the feedback oscillation. Note that the rate of the output oscillation ($f_{OUT}$) is dependent upon the divider value (N) times the rate of the reference oscillation ($f_{IN}$), where $f_{OUT}=N*f_{IN}$.

When the desired rate between the output oscillation and the reference oscillation is an integer, the design of the feedback divider is relatively simple and straightforward. When the desired rate between the output oscillation and the reference oscillation is not an integer, there are several ways to achieve a fractional divider value. One technique is to divide the reference oscillation by M prior to the phase and/or frequency detector. This provides an output oscillation rate of $N/M*f_{IN}$. Another technique is to use a fractional-N divider that causes the divider value to bounce back and forth between N and N+1 at a controlled rate to achieve a relative divider value of N.fff, where the "fff" corresponds to a fractional value.

An issue with the fractional-N PLLs is the jitter caused by the constant switching between the two divider values N and N+1. To minimize the adverse affects of the jitter, the overall bandwidth of the PLL is reduced such that as much jitter energy as possible is filtered out by the PLL. However, a narrow bandwidth PLL is susceptible to internally generated noise, which can be filtered out by a wide bandwidth PLL. Thus, the designer must choose between tradeoff a wideband PLL for fractional N divider. This situation makes a low jitter fractional N PLL difficult to design.

Therefore, a need exists for an improved PLL that simultaneously provides a wide bandwidth to reduce internally generated jitter while implementing a fractional-N divider in a low jitter architecture.

DETAILED DESCRIPTION OF THE INVENTION

Figure 1:
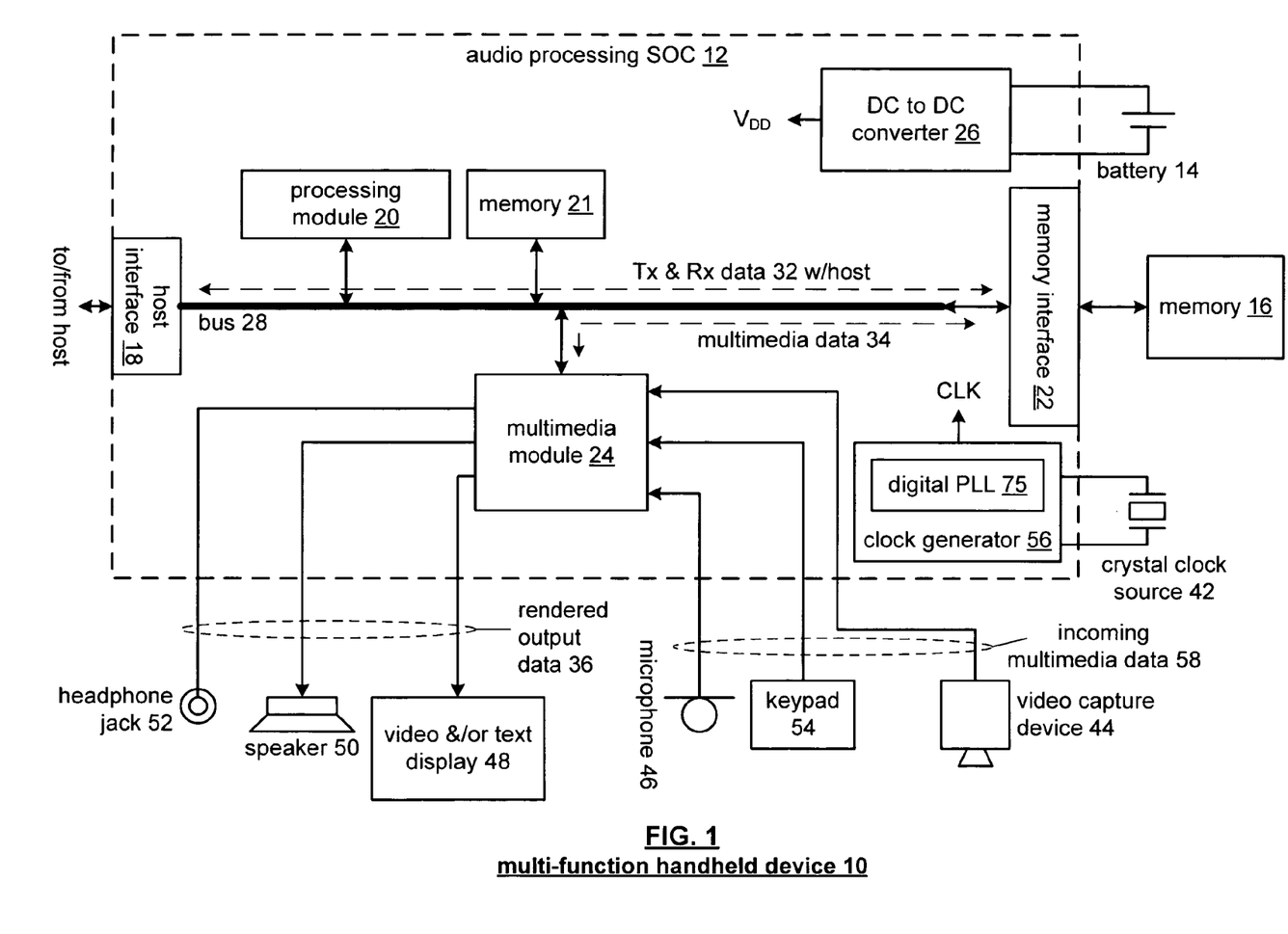
FIG. 1 is a schematic block diagram of an embodiment of an audio processing system on a chip (SOC) in accordance with the present invention.

FIG. 1 is a schematic block diagram of an embodiment of a handheld device 10 that includes an audio processing system on a chip (SOC) 12, a battery 14, memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The audio processing SOC 12 includes a host interface 18, a processing module 20, memory 21, a memory interface 22, a multimedia module 24, a DC-to-DC converter 26, and a clock generator 56, which includes a digital phase locked loop 75 and produces a clock signal (CLK) for use by the other modules. As one of average skill in the art will appreciate, the clock signal CLK may include multiple clock signals at varying rates for the various operations of the multi-function handheld device and be derived from the digital PLL 75.

When the multi-function handheld device 10 is operably coupled to a host device, which may be a personal computer, workstation, server, and/or any other device that may transceive data with the multi-function handheld device, it is in a first function mode. In the first functional mode, the processing module 20 receives signals, including audio signals, and processes them to produce processed signals, including processed audio signals. The processing may be done in accordance with one or more audio and/or video processing protocols including, but not limited to, MP3, WMA—Windows Media Architecture, mp3 PRO, Ogg Vorbis, AAC—Advanced Audio Coding, MPEG (motion picture expert group), and JPEG (joint photographic expert group). Note that the processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory 21 may be a single memory device or a plurality of memory devices that stores at least one of data and instructions. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

When the handheld device 10 is not coupled to the host device, it is placed in a second operational mode. In the second operational mode, the processing module 20 retrieves, and subsequently executes, a second set of operational instructions from memory 16 and/or 21 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In addition, the handheld device 10 may store digital information received via one of the multimedia input devices 44, 46, and 54. For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this extension of the first operational mode, the processing module 20 arbitrates write access to the memory 16 among the various input sources (e.g., the host and the multimedia module).

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, a processing unit (e.g., the processing module 20 and/or the multimedia module 24) converts the data 34 into rendered output data 36. For example, the processing unit may convert digitized data into analog signals that are subsequently amplified via the one or more audio output modules based on a volume control signal received via an IC pin. The audio output module(s) provides the amplified analog signals to a speaker 50 or via a headphone jack 52. In addition, or in the alternative, the multimedia module 24 may render digital video data and/or digital text data into RGB (red-green-blue), YUV, etc., data for display on video and/or text display 48, which may be an LCD (liquid crystal display) monitor, projection CRT, digital light projection (DLP), and/or a plasma type display.

As one of average skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 2:
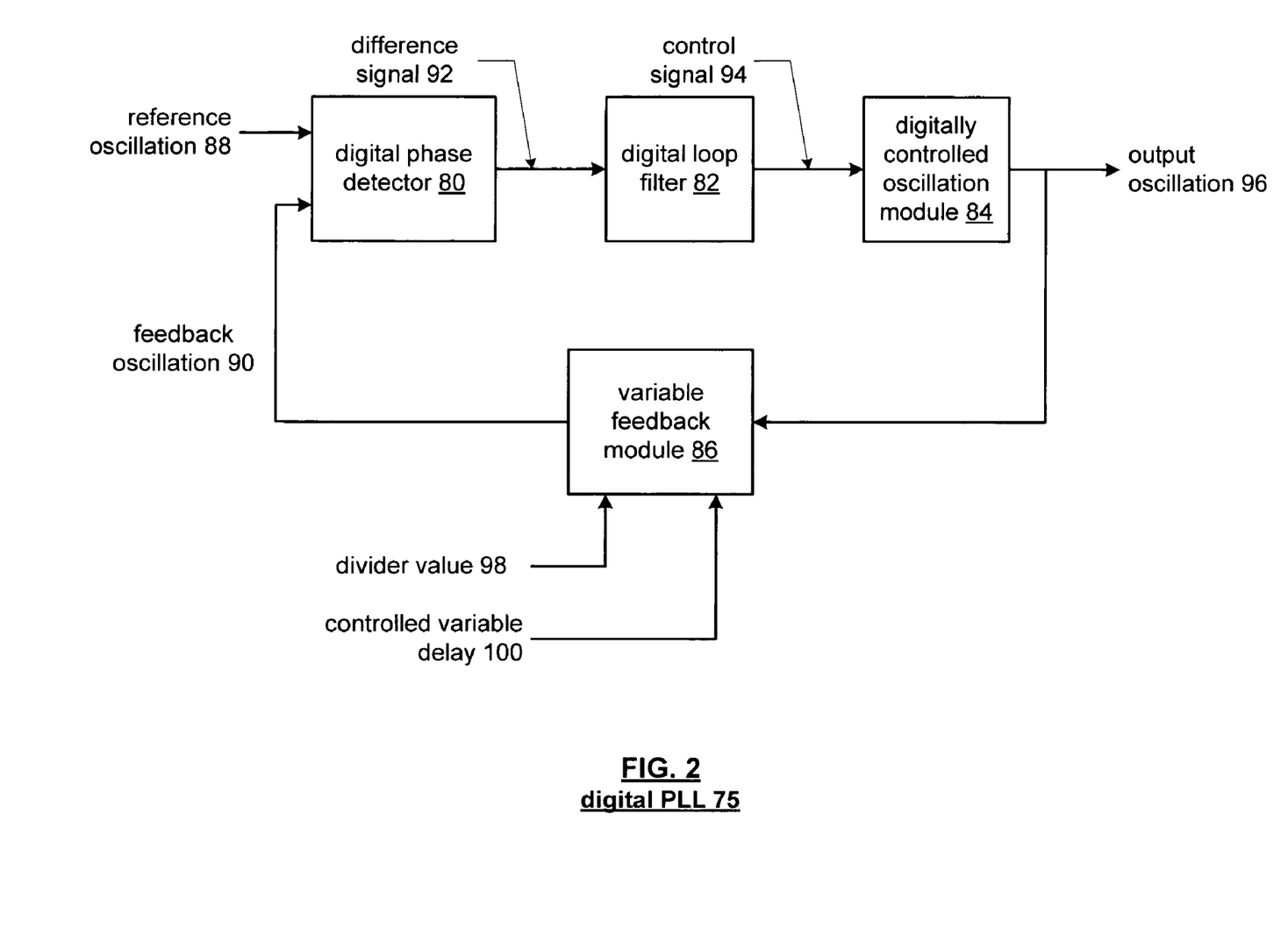
FIG. 2 is a schematic block diagram of an embodiment of a digital phase locked loop (PLL) in accordance with the present invention.

FIG. 2 is a schematic block diagram of an embodiment of a digital phase locked loop (PLL) 75 that includes a digital phase detector 80, a digital loop filter 82, a digitally controlled oscillation module 84, and a variable feedback divider 86. The digital phase detector 80 is coupled to produce a difference signal 92 based on a phase difference between a reference oscillation 88 and a feedback oscillation 90. In one embodiment, the difference signal 92 is a digital signal having a logic value of 1 to indicate speeding up the PLL and a logic value of 0 to indicate slowing down the PLL.

The digital loop filter 82 is coupled to process the difference signal 92 to produce a control signal 94. In one embodiment, the digital loop filter 82 is a digital to analog converter that converts the difference signal 92 into an analog control voltage 94. In another embodiment, the digital loop filter 82 is a digital encoder that converts, for a given period of time, the difference signal 92 into a digital value.

The digitally controlled oscillation module 84 is coupled to generate an output oscillation 96 based on the control signal 94. In one embodiment, the digitally controlled oscillation module 84 is a voltage controlled oscillator that converts the analog control voltage into the output oscillation 96. In another embodiment, the digitally controlled oscillation module 84 includes digital circuitry to convert the digital value corresponding to the control signal 94 into the output oscillation.

The variable feedback divider 86 is coupled to produce the feedback oscillation 90 from the output oscillation 96 based on a divider value 98 and a controlled variable delay 100. Embodiments of the variable feedback divider 86 will be described in greater detail with reference to FIGS. 3-9.

Figure 3:
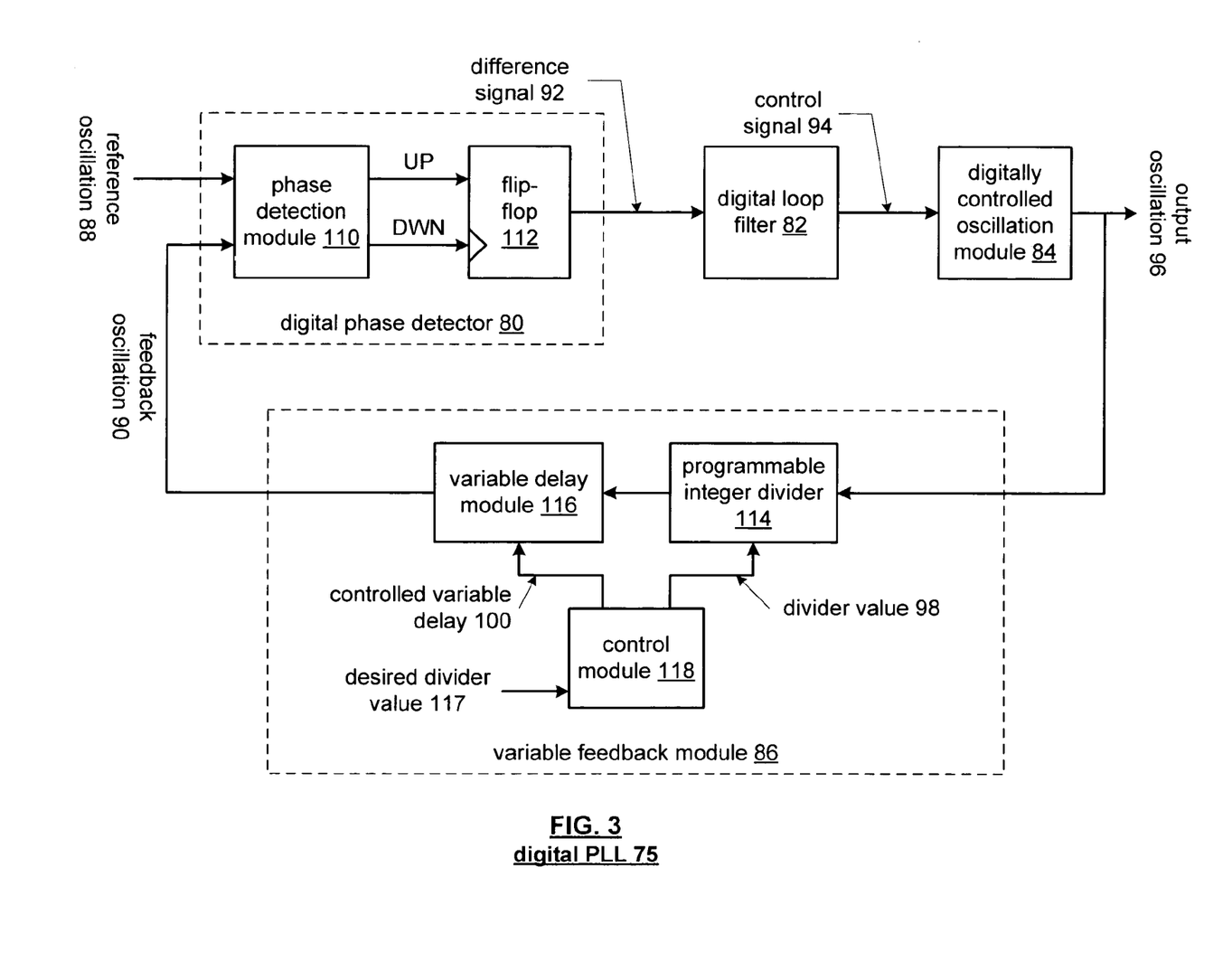
FIG. 3 is a schematic block diagram of another embodiment of a digital PLL in accordance with the present invention.

FIG. 3 is a schematic block diagram of another embodiment of a digital PLL 75 that includes a digital phase detector 80, a digital loop filter 82, a digitally controlled oscillation module 84, and a variable feedback divider 86. In this embodiment, the digital phase detector 80 includes a phase detection module 110 and a flip-flop 112. The variable feedback module 86 includes a programmable integer divider 114, a variable delay module 116, and a control module 118.

The phase detection module 110 is coupled to produce an up signal (UP) when the phase of reference oscillation 88 leads the phase of the feedback oscillation 90 and to produce a down signal (DWN) when the phase of the feedback oscillation 90 leads the phase of the reference oscillation 88. The flip-flop 112 may be a D flip-flop where the clock input is coupled to receive the down signal and the D input is coupled to receive the up signal. When the up signal is produced prior to the down signal, the flip-flop latches a logic 1 and when the down signal is produced prior to the up signal, the flip-flop latches a logic 0. The combination of logic 0s and 1s constitutes the difference signal 92. the digital loop filter 82 and the digitally controlled oscillation module 84 function as previously described to produce the output oscillation 96.

The programmable integer divider module 114 is coupled to produce an integer divided oscillation based on the divider value. In one embodiment, the programmable integer divider module 114 functions similarly to a fractional-N divider to toggle between a divider value of N and a divider value of N+1 based on the divider value control signal 98, which may be time varying.

The variable delay module 116 is coupled to produce the feedback oscillation 90 based on the integer divided oscillation and the controlled variable delay 100. In one embodiment, the variable delay module 116 delays the output of the programmable integer divider module 114 to produce the feedback oscillation 90 having less jitter. As such, the bandwidth of the digital PLL 75 may be wide (e.g., near 1/20 of the reference frequency). The control module 118 is coupled to produce the divider value 98 and the controlled variable delay 100 in accordance with a desired divider value 117.

Figure 4:
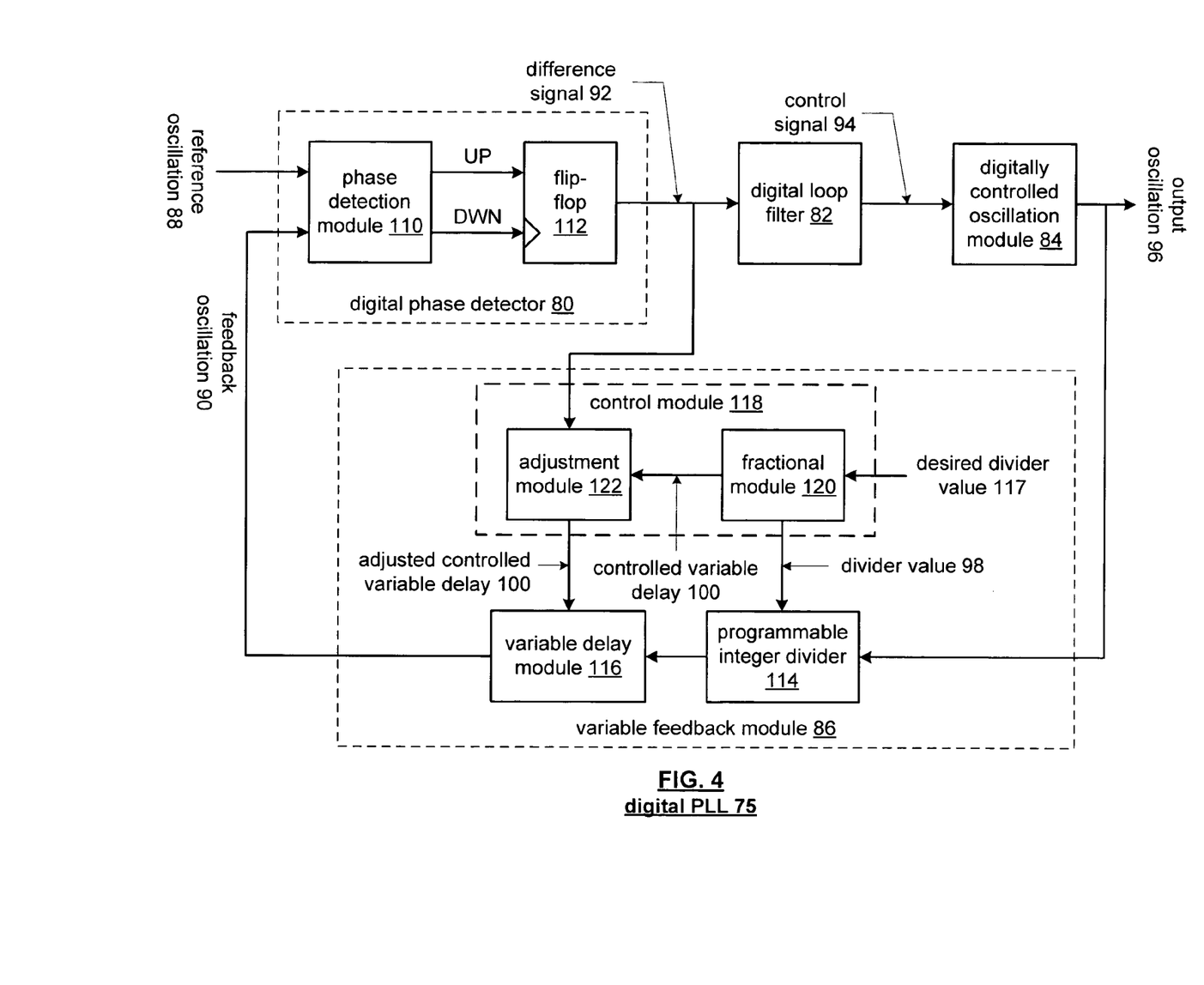
FIG. 4 is a schematic block diagram of another embodiment of a digital PLL in accordance with the present invention.

FIG. 4 is a schematic block diagram of another embodiment of a digital PLL 75 that includes a digital phase detector 80, a digital loop filter 82, a digitally controlled oscillation module 84, and a variable feedback divider 86. In this embodiment, the digital phase detector 80 includes a phase detection module 110 and a flip-flop 112. The variable feedback module 86 includes a programmable integer divider 114, a variable delay module 116, and a control module 118. The control module 118 includes a fractional module 120 and an adjustment module 122. The functionality of the digital phase detector 80, the digital loop filter 82, and the digitally controlled oscillation module 84 is as previously described.

As shown, the control module 118 includes the fractional module 120 and an adjustment module 122. The fractional module 120 is coupled to generate the controlled variable delay and divider value based on the desired divider value 117. For example, the divider value may be N or N+1 and vary over time. Further, the controlled variable delay is a phase delay that delays a cycle of the feedback oscillation by a controlled amount such that the actual feedback oscillation more closely resembles an ideal feedback oscillation than a fractional-N based feedback oscillation. The adjustment module 122 is coupled to adjust the controlled variable delay based on the difference signal. In one embodiment, the adjustment module 122 determines a maximum delay of the feedback oscillation based on the difference signal. This maximum delay is then used to adjust the delay provided by the variable delay module 116 to compensate for process variation differences and/or temperature variation changes.

Figure 5:
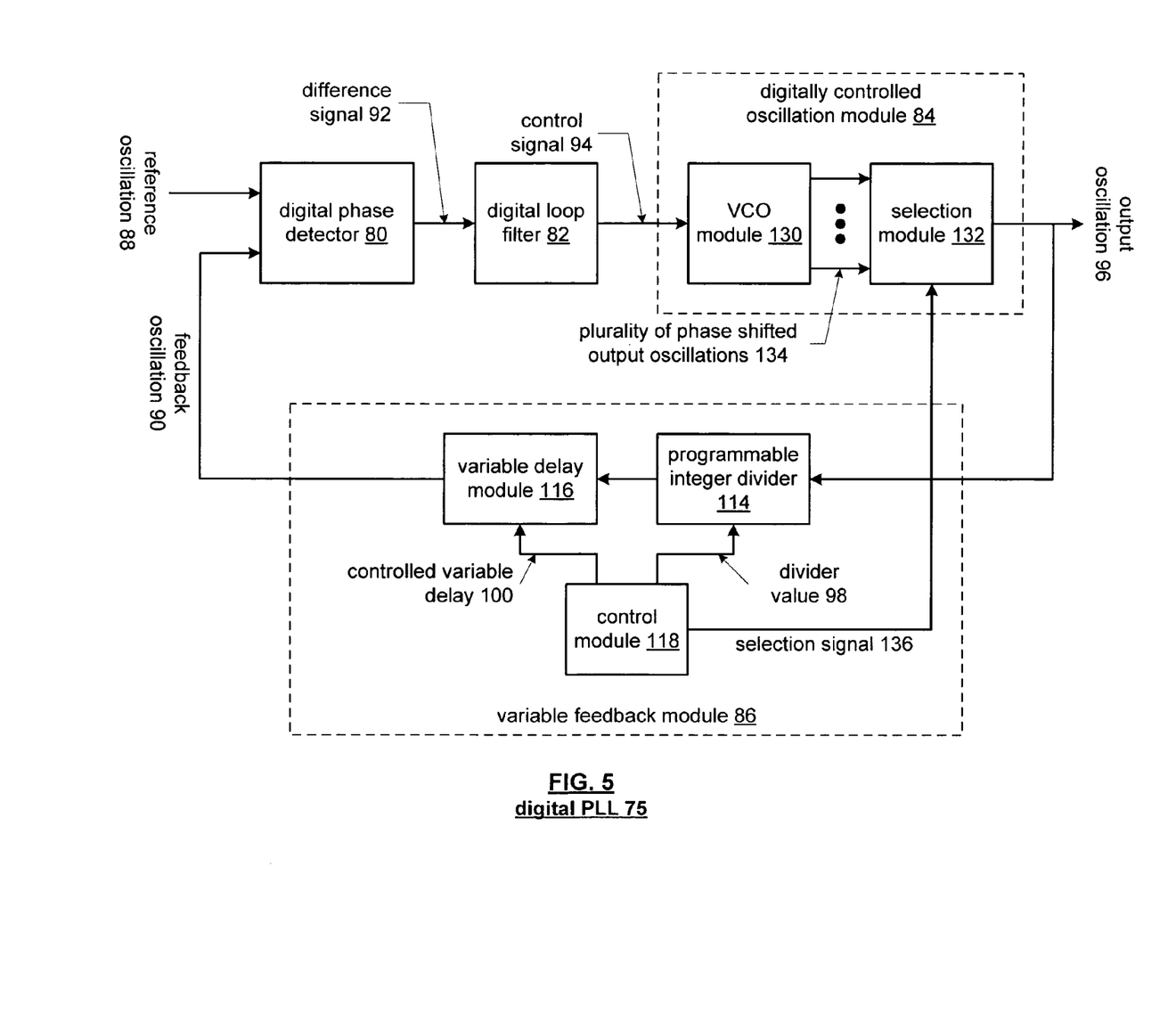
FIG. 5 is a schematic block diagram of another embodiment of a digital PLL in accordance with the present invention.

FIG. 5 is a schematic block diagram of another embodiment of a digital PLL that includes a digital phase detector 80, a digital loop filter 82, a digitally controlled oscillation module 84, and a variable feedback divider 86. In this embodiment, the variable feedback module 86 includes a programmable integer divider 114, a variable delay module 116, and a control module 118. In addition, the digitally controlled oscillation module 84 includes an oscillation module 130 and a selection module 132. The functionality of the digital phase detector 80 and the digital loop filter 82 is as previously discussed.

The oscillation module 130, which may be a voltage controlled or current controlled oscillator, is coupled to generate a plurality of phase shifted output oscillations 134 based on the control signal 94. The selection module 132 selects one of the plurality of phase shifted output oscillations 134 based on a selection signal 136 to produce the output oscillation 96. In one embodiment, the control module 118 generates the selection signal 136 in combination with the divider value 98 and the controlled variable delay 100 to obtain various phases of the output oscillation to further reduce jitter of the feedback oscillation 90.

Figure 6:
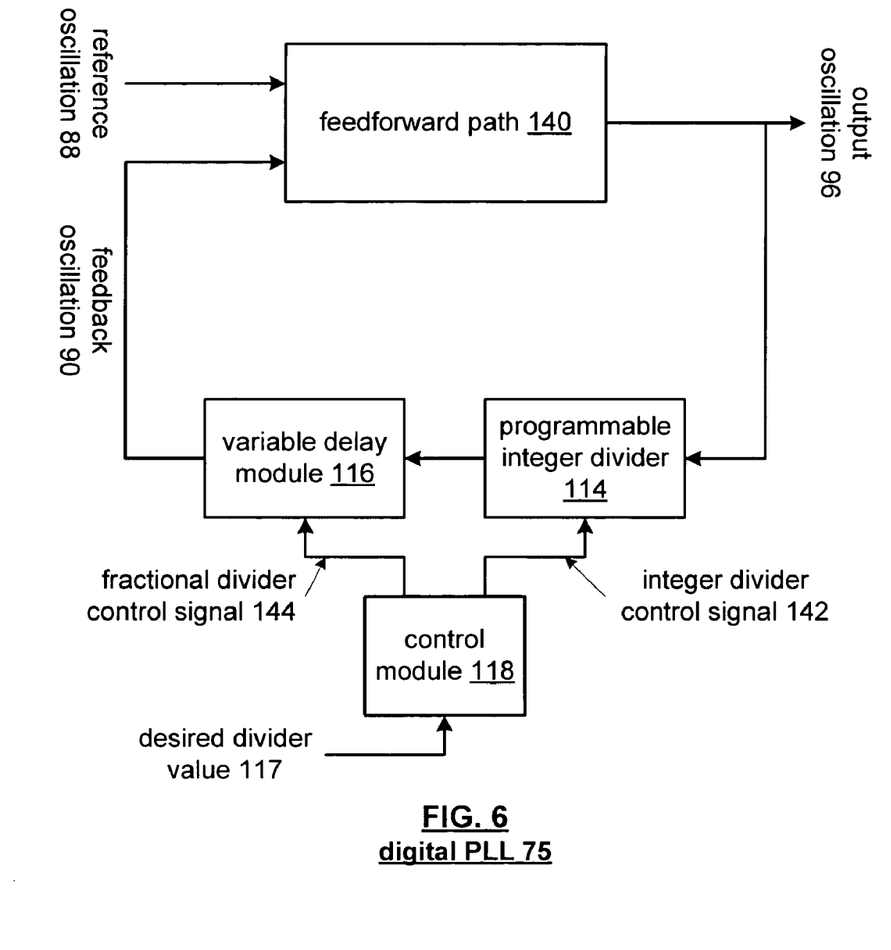
FIG. 6 is a schematic block diagram of another embodiment of a digital PLL in accordance with the present invention.

FIG. 6 is a schematic block diagram of another embodiment of a PLL 75 that includes a feedforward path 140, the programmable integer divider 114, the variable delay module 116, and the control module 118. The feedforward path 140, which may include one of the topologies illustrated in FIGS. 2-5 or may be a conventional analog path, is coupled to convert the reference oscillation 88 and the feedback oscillation 90 into the output oscillation 96.

The programmable integer divider module 114 is coupled to produce an integer divided oscillation (e.g., the output oscillation divided by a divider value of N or N+1) based on an integer divider control signal 142, which may be time varying. The variable delay module 116 is coupled to produce the feedback oscillation 90 based on the integer divided oscillation and a controlled variable delay signal 144. The control module 118 is coupled to produce the integer divider control signal 142 and the controlled variable delay signal 144 in accordance with a desired divider value 117.

Figure 7:
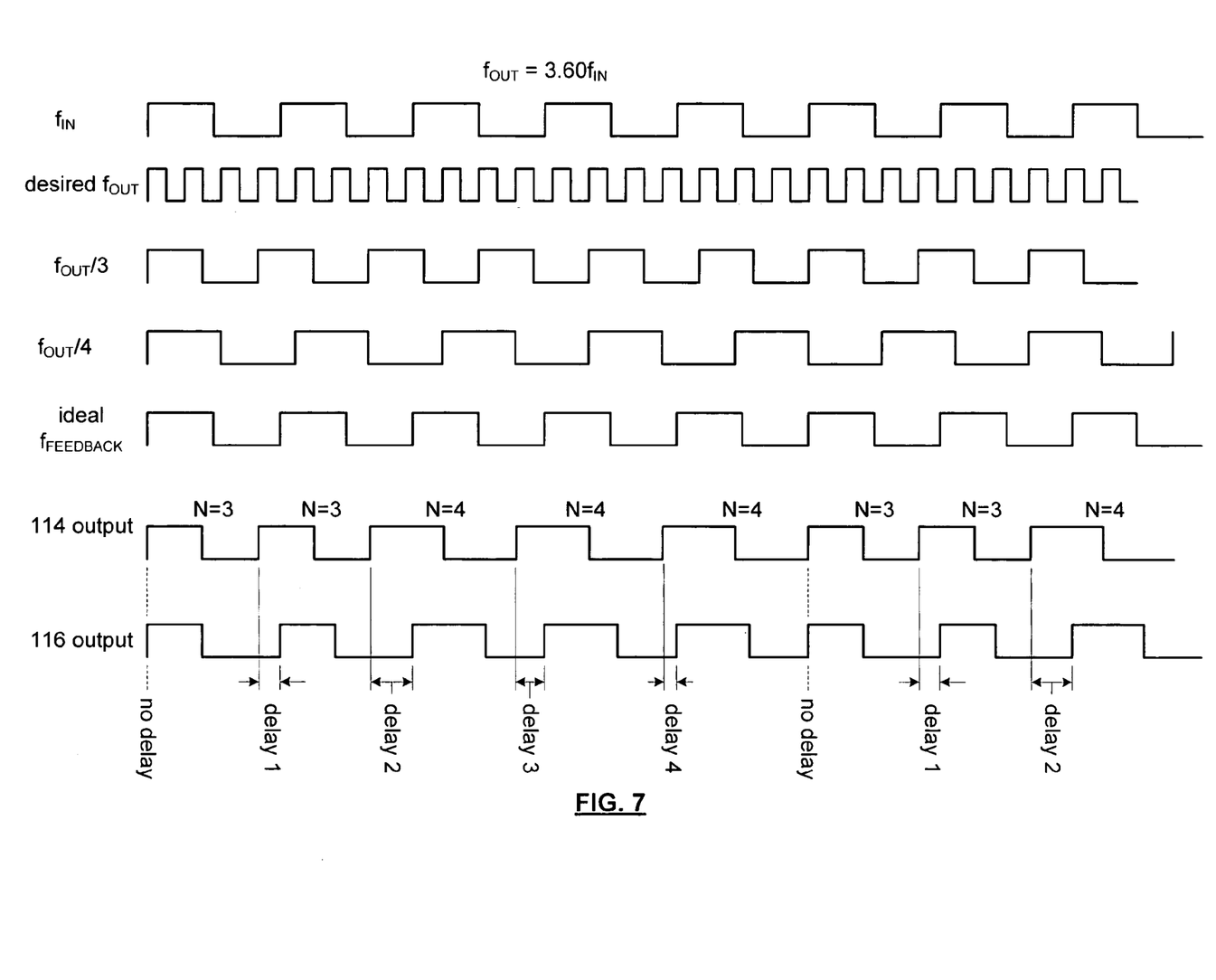
FIG. 7 is an example timing diagram of a digital PLL in accordance with the present invention.

FIG. 7 is an example timing diagram of a digital PLL in accordance with one or more of the embodiments illustrated in FIGS. 2-6. In this example, the output frequency is 3.60 times the input frequency. For reference, the 3.60-to-1 ratio corresponds to eighteen cycles of the output oscillation (e.g. desired $f_{OUT}$) per every five cycles of the reference oscillation (e.g., $f_{IN}$). The diagram further includes a waveform for the output oscillation divided by three (e.g., $f_{OUT}/3$) and a waveform for the output oscillation divided by four (e.g., $f_{OUT}/4$).). Note that the waveforms fout/3 and fout/4 may not appear as shown in FIG. 7 inside the PLL. These waveforms are shown for clarity to compare the periods in each of these waveforms to the two different period lengths in the output 114 waveform. In implementation of a variable divider, the divide by 3 or divide by 4 is done by switching a control signal into a Variable divider, not by choosing between 2 free running waveforms of different divider factors.

To achieve the 3.6 divider ratio, the integer divider is toggled between divide by 3 and divide by four. The control module 118 determines the pattern of toggling of the integer divider value based on the desired period of the feedback oscillation, the period of a divide by 3 oscillation (e.g., $f_{OUT}/3$) and the divided by four oscillation (e.g., $f_{OUT}/4$) such that, over time, the average period equals the desired period. For example, if the desired period of the feedback oscillation is 1.000, the period of the divide by 3 oscillation is 0.8333, the period of the divide by 4 oscillation is 1.111, T=number of cycles in a repeat pattern, x=the number of divide by 3 cycles per repeat pattern, and T−x=the number of divide by 4 cycles per repeat pattern, then 1.000=(0.8333x+1.111(T−x))/T. Solving this equation yields T=5, x=2, and T−x=3 such that per every five cycles of the feedback oscillation, 2 are a result of dividing the output oscillation by 3 and the other 3 are a result of dividing the output oscillation by 4.

For this example, the control module 118 provides divide by 3 and divide by 4 divider values to the programmable integer divider 114 in the above pattern, which produces the waveform labeled 114 output. Such a waveform is similar to the feedback oscillation produced by a fractional-N divider. Comparing the 114 output waveform to the ideal feedback oscillation (e.g., $f_{FEEDBACK}$) reveals that the lead edges of the 114 output waveform lines up with the leading edges of the ideal feedback oscillation once every five cycles. The difference in timing between the ideal feedback oscillation and the 114 output waveform produce jitter, which if not corrected as subsequently described, would require the loop filter to filter the jitter thereby reducing the PLL's bandwidth.

The control module 118 generates a controlled variable delay on a cycle by cycle basis of the feedback oscillation that enables the variable delay module 116 to adjust the delay of the output of the programmable integer divider 114. As shown in the present example, the first pulse of the feedback oscillation (e.g., the output of the variable delay module 116) is not delayed by the variable delay module 116. The next pulse, however, is delayed by a first delay (e.g., delay 1). The next three cycles that are the result of divide by 4 (e.g., N=4) are delayed by delays 2-4, respectively. The next cycle repeats the pattern as previously described. Note that in FIG. 4, adjustment module 122 process the difference signal 92 in such a way as to properly calibrate the delay scaling such that the delay adjustment described above is robust to process and temperature changes. For example adjustment module 122 could low pass filter the difference signal to control the value of the delay to complete a negative feedback control loop.

The control module 118 can readily generate the delays based on the known desired period of the feedback oscillation, the period of the divide by 3 oscillation, the period of the divide by 4 oscillation, the repeat pattern, and aligning the leading edge, or trailing edge, of the actually feedback oscillation with the ideal feedback oscillation, which is equal to the reference oscillation (e.g., $f_{IN}$). As one of ordinary skill in the art will appreciate, the timing diagram of FIG. 7 is meant as an example of operation and it concepts are readily adaptable to more practical implementations of PLLs.

Figure 8:
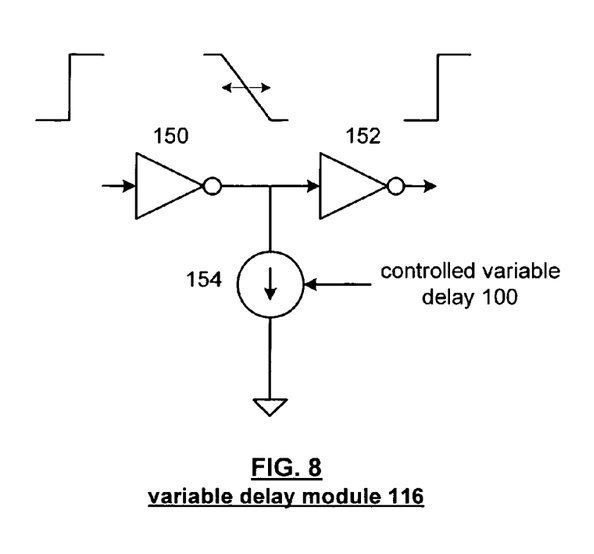
FIG. 8 is a schematic block diagram of an embodiment of a variable delay module in accordance with the present invention.

FIG. 8 is a schematic block diagram of an embodiment of a variable delay module 116 that includes a pair of inverters 150 and 152 and a controlled current source 154. In this embodiment, inverter 150 receives the output of the programmable integer module 114 and inverts it at a speed controlled by the controlled current source 154. For instance, if the controlled variable delay 100 indicates no delay, the current source is providing no load on inverter 150 such that the output of inverter 150 transitions at the speed of the inverter 150. As the controlled variable delay 100 changes, the loading of inverter 150 by the current source changes thereby changing the slew rate of inverter 150 to produce the desired delay. The delayed inversion of the feedback oscillation is inverted again by inverter 152 to produce the feedback oscillation. In this embodiment, inverter 152 serves as a buffering device and so could be eliminated in alternate embodiments.

Figure 9:
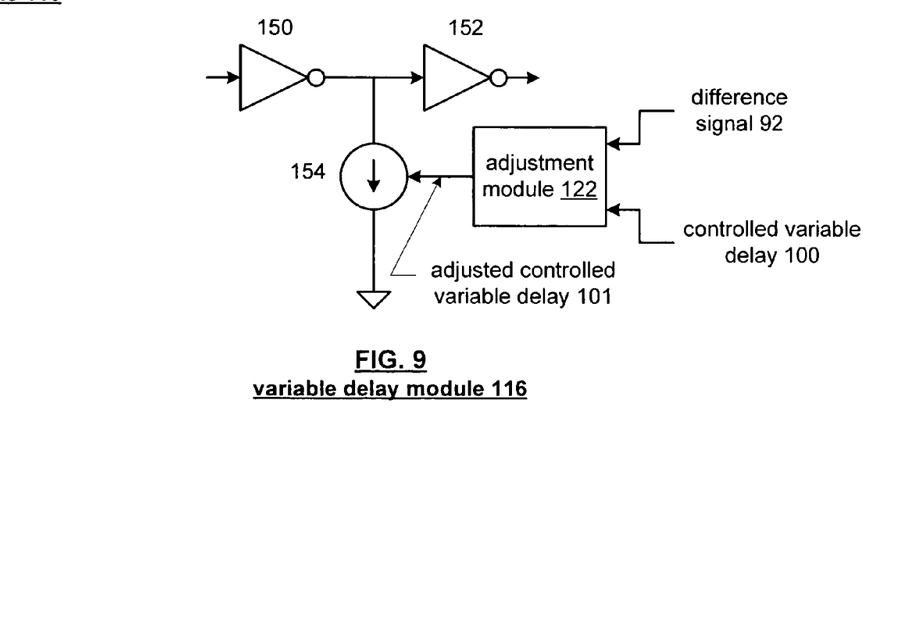
FIG. 9 is a schematic block diagram of another embodiment of a variable delay module in accordance with the present invention.

FIG. 9 is a schematic block diagram of another embodiment of a variable delay module 116 that includes a pair of inverters 150 and 152, a controlled current source 154, and the adjustment module 122. In this embodiment, the adjustment module 122 generates an adjusted controlled variable delay 101 based on the difference signal 92 and the controlled variable delay 100. The difference signal 92 provides an indication of the maximum delay that the variable delay module 116 has to produce, which is used by the adjustment module 122 to adjust the controlled variable delay 100 to adjust for performance differences caused by process variations and/or temperature variations. Note that the current source 154 may be implemented using transistors where the biasing of the transistors is changed in accordance with the variable controlled variable delay 101 or the controlled variable delay 100.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few, percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A phase locked loop (PLL) comprising:
   a feedforward path coupled to convert a reference oscillation and a feedback oscillation into an output oscillation, wherein the feedforward path comprises:
      a voltage controlled oscillation module coupled to generate a plurality of phase shifted output oscillations based on a phase difference between the reference oscillation and the feedback oscillation; and a selection module coupled to select one of the plurality of phase shifted output oscillations based on a selection signal to produce the output oscillation;

a programmable integer divider module to produce an integer divided oscillation based on an integer divider control signal;

a variable delay module coupled to produce the feedback oscillation based on the integer divided oscillation and a fractional divider control signal; and control module coupled to produce the integer divider control signal and the fractional divider control signal in accordance with a desired divider value.

2. The PLL of claim 1, wherein the control module further functions to:

generate a time varying integer divider control signal in accordance with the desired divider value.

3. The PLL of claim 1, wherein the control module comprises:

a fractional module coupled to generate the integer divider control signal and the fractional divider control signal in accordance with the desired divider value; and an adjustment module coupled to adjust the fractional divider control signal based on the difference signal.

4. The PLL of claim 1, wherein the control module further functions to generate the selection signal based on the desired divider value.

5. The PLL of claim 1, wherein the feedforward path comprises:

a digital phase detector coupled to produce a difference signal based on a phase difference between the reference oscillation and the feedback oscillation;

a loop filter coupled to process the difference signal to produce a control signal; and wherein said voltage controlled oscillation module and said selection module collectively comprise a digitally controlled oscillation module coupled to generate the output oscillation based on the control signal.

6. The PLL of claim 5, wherein the digital phase detector comprises:

a phase detection module coupled to produce an up signal when phase of the reference oscillation leads phase of the feedback oscillation and to produce a down signal when the phase of the feedback oscillation leads the phase of the reference oscillation; and a flip-flop coupled to convert the up and down signals into the difference signal.

7. An audio processing system on a chip (SOC) comprising:

a processing module coupled to process digital audio signals in accordance with a digital audio protocol;

memory coupled to the processing module for storing at least one of data and instructions;

a phase locked loop (PLL) coupled to provide at least one clocking signal to the processing module, wherein the digital PLL includes:

a feedforward path coupled to convert a reference oscillation and a feedback oscillation into an output oscillation, wherein the at least one clocking signal is derived from the output oscillation, and wherein the feedforward path comprises:

a voltage controlled oscillation module coupled to generate a plurality of phase shifted output oscillations based on a phase difference between the reference oscillation and the feedback oscillation; and a selection module coupled to select one of the plurality of phase shifted output oscillations based on a selection signal to produce the output oscillation;

a programmable integer divider module to produce an integer divided oscillation based on an integer divider control signal;

a variable delay module coupled to produce the feedback oscillation based on the integer divided oscillation and a controlled variable delay signal; and control module coupled to produce the integer divider control signal and the controlled variable delay signal in accordance with a desired divider value.

8. The audio processing SOC of claim 7, wherein the control module further functions to:

generate a time varying integer divider control signal in accordance with the desired divider value.

9. The audio processing SOC of claim 7, wherein the control module comprises:

a fractional module coupled to generate the integer divider control signal and the controlled variable delay signal in accordance with the desired divider value; and an adjustment module coupled to adjust the controlled variable delay signal based on the difference signal.

10. The audio processing SOC of claim 7, wherein the control module further functions to generate the selection signal based on the desired divider value.

11. The audio processing SOC of claim 7, wherein the feedforward path comprises:

a digital phase detector coupled to produce a difference signal based on a phase difference between the reference oscillation and the feedback oscillation;

a loop filter coupled to process the difference signal to produce an oscillation control signal; and wherein said voltage controlled oscillation module and said selection module collectively comprise a digitally controlled oscillation module coupled to generate the output oscillation based on the oscillation control signal.

12. The audio processing SOC of claim 11, wherein the digital phase detector comprises:

a phase detection module coupled to produce an up signal when phase of the reference oscillation leads phase of the feedback oscillation and to produce a down signal when the phase of the feedback oscillation leads the phase of the reference oscillation; and a flip-flop coupled to convert the up and down signals into the difference signal.

* * * * *